(12) United States Patent
Liu et al.

(10) Patent No.: US 12,471,267 B2
(45) Date of Patent: Nov. 11, 2025

(54) TRANSISTOR AND MANUFACTURING METHOD THEREOF, AND MEMORY

(71) Applicant: CHANGXIN MEMORY TECHNOLOGIES, INC., Hefei (CN)

(72) Inventors: Youming Liu, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 554 days.

(21) Appl. No.: 17/816,156

(22) Filed: Jul. 29, 2022

(65) Prior Publication Data

US 2023/0389276 A1    Nov. 30, 2023

Related U.S. Application Data

(63) Continuation of application No. PCT/CN2022/098249, filed on Jun. 10, 2022.

(30) Foreign Application Priority Data

May 31, 2022    (CN) .......................... 202210608341.1

(51) Int. Cl.
  *H10D 30/67*    (2025.01)
  *H10B 12/00*    (2023.01)
(52) U.S. Cl.
  CPC ............. *H10B 12/30* (2023.02); *H10B 12/05* (2023.02)
(58) Field of Classification Search
  CPC ..... H10B 12/30; H10B 12/05; H10D 30/6728
  See application file for complete search history.

(56) References Cited

U.S. PATENT DOCUMENTS 5,386,132 A    1/1995  Wong
6,133,141 A   10/2000  Kim
(Continued)

FOREIGN PATENT DOCUMENTS

CN    1458683 A    11/2003
CN    1499639 A     5/2004
(Continued)

OTHER PUBLICATIONS

"Novel Vertical Channel-All-Around (CAA) In-Ga-Zn-O FET for 2TOC-DRAM With High Density Beyond 4F2 by Monolithic Stacking", Xinlv Duan, IEEE Transactions On Electron Devices, vol. 69, No. 4, pp. 2196-2202, Apr. 2022 (Year: 2022).*

(Continued)

*Primary Examiner* — S M Sohel Imtiaz
(74) *Attorney, Agent, or Firm* — Syncoda LLC; Feng Ma

(57) ABSTRACT

The present disclosure provides a transistor and a manufacturing method thereof, and a memory, relates to the technical field of semiconductors. The transistor includes: a channel, wherein an accommodation space is formed therein; a gate, provided with a first end and a second end that are opposite, wherein the first end of the gate is located inside the accommodation space, and the second end of the gate is located outside the accommodation space; a dielectric layer, located between the gate and a channel, insulating and isolating the gate and the channel; a source, provided at one end of the channel; and a drain, provided at the other end of the channel, wherein the drain and the source are arranged at intervals along a length direction of the channel, and the source, the drain, and the channel are each made of a semiconductor material.

10 Claims, 4 Drawing Sheets

(56) References Cited

U.S. PATENT DOCUMENTS

| | | | |
|---|---|---|---|
| 6,459,112 B1 | 10/2002 | Tsuboi | |
| 6,756,652 B2 | 6/2004 | Yano et al. | |
| 6,815,300 B2 | 11/2004 | Jeong et al. | |
| 8,309,416 B2 | 11/2012 | Park et al. | |
| 10,515,981 B2 | 12/2019 | Or-Bach et al. | |
| 11,145,765 B2 | 10/2021 | Chung et al. | |
| 11,201,213 B2 | 12/2021 | Chen | |
| 11,398,492 B2 | 7/2022 | Yan et al. | |
| 11,411,007 B2 | 8/2022 | Lee et al. | |
| 11,723,191 B2 | 8/2023 | Choi et al. | |
| 11,765,892 B2 | 9/2023 | Young et al. | |
| 11,839,085 B2 * | 12/2023 | Yin | H10D 64/689 |
| 2003/0002359 A1 | 1/2003 | Kieslich | |
| 2003/0139011 A1 | 7/2003 | Cleeves et al. | |
| 2005/0001253 A1 | 1/2005 | Sugimura | |
| 2006/0240622 A1 | 10/2006 | Lee et al. | |
| 2007/0228427 A1 | 10/2007 | Matsui et al. | |
| 2012/0161229 A1 * | 6/2012 | Kwon | H10B 12/00 |
| | | | 438/270 |
| 2012/0168848 A1 | 7/2012 | Ahn | |
| 2012/0175607 A1 * | 7/2012 | Shu | H10D 30/6755 |
| | | | 257/43 |
| 2013/0052803 A1 * | 2/2013 | Roizin | H01L 21/764 |
| | | | 257/E21.09 |
| 2013/0264621 A1 | 10/2013 | Nishi et al. | |
| 2013/0320433 A1 * | 12/2013 | Cho | H10D 30/025 |
| | | | 257/329 |
| 2015/0228623 A1 | 8/2015 | Oh et al. | |
| 2019/0103407 A1 | 4/2019 | Kim et al. | |
| 2019/0198675 A1 | 6/2019 | Sharma et al. | |
| 2019/0252386 A1 | 8/2019 | Lee | |
| 2020/0043941 A1 * | 2/2020 | Kim | H10B 43/40 |
| 2020/0083225 A1 | 3/2020 | Ma et al. | |
| 2020/0227416 A1 * | 7/2020 | Lilak | H10B 12/05 |
| 2020/0251151 A1 | 8/2020 | Kang et al. | |
| 2020/0266113 A1 | 8/2020 | Tsugawa | |
| 2020/0381450 A1 | 12/2020 | Lue et al. | |
| 2021/0020747 A1 | 1/2021 | Chen | |
| 2021/0151437 A1 | 5/2021 | Tomishima | |
| 2021/0159229 A1 | 5/2021 | Gomes et al. | |
| 2021/0257366 A1 | 8/2021 | Lee | |
| 2021/0296320 A1 * | 9/2021 | Sandhu | H10D 1/692 |
| 2021/0375875 A1 | 12/2021 | Brewer et al. | |
| 2021/0375926 A1 | 12/2021 | Mehandru et al. | |
| 2022/0005809 A1 | 1/2022 | Kim et al. | |
| 2022/0028882 A1 | 1/2022 | Lee | |
| 2022/0085023 A1 | 3/2022 | Shin et al. | |
| 2022/0130856 A1 | 4/2022 | Kim et al. | |
| 2022/0157819 A1 | 5/2022 | Jung et al. | |
| 2023/0103593 A1 * | 4/2023 | Sakuma | H10D 30/6755 |
| | | | 257/43 |
| 2023/0363143 A1 * | 11/2023 | Lee | H10B 12/488 |
| 2023/0389261 A1 | 11/2023 | Liu | |

FOREIGN PATENT DOCUMENTS

| | | |
|---|---|---|
| CN | 102034759 A | 4/2011 |
| CN | 102544016 A | 7/2012 |
| CN | 107623033 A | 1/2018 |
| CN | 108401468 A | 8/2018 |
| CN | 108428703 A | 8/2018 |
| CN | 110875315 A | 3/2020 |
| CN | 110890371 A | 3/2020 |
| CN | 112466881 A | 3/2021 |
| CN | 112838088 A | 5/2021 |
| CN | 113424319 A | 9/2021 |
| CN | 113889473 A | 1/2022 |
| CN | 113972213 A | 1/2022 |
| CN | 114334980 A | 4/2022 |
| CN | 114373760 A | 4/2022 |
| CN | 114429944 A | 5/2022 |
| CN | 114446963 A | 5/2022 |
| CN | 114497055 A | 5/2022 |
| EP | 3826058 A1 | 5/2021 |
| JP | 2005252283 A | 9/2005 |
| KR | 20090118299 A | 11/2009 |
| KR | 1020190038223 A | 4/2019 |
| KR | 1020220059424 A | 5/2022 |
| TW | 200418168 A | 9/2004 |
| TW | 201643994 A | 12/2016 |
| TW | 202118058 A | 5/2021 |
| TW | 202205539 A | 2/2022 |
| TW | 202218129 A | 5/2022 |
| WO | 2019204795 A1 | 10/2019 |

OTHER PUBLICATIONS

Extended European search report in application No. 22924572.5, mailed on Jul. 23, 2024.

International Search Report cited in PCT/CN2022/098247 mailed Dec. 19, 2022, 9 pages.

International Search Report cited in PCT/CN2022/098020 mailed Dec. 19, 2022, 9 pages.

International Search Report cited in PCT/CN2022/098018 mailed Dec. 28, 2022, 8 pages.

International Search Report cited in PCT/CN2022/098017 mailed Dec. 19, 2022, 9 pages.

International Search Report cited in PCT/CN2022/097528 mailed Dec. 16, 2022, 8 pages.

International Search Report cited in PCT/CN2022/098249 mailed Dec. 26, 2022, 9 pages.

US non final office action in U.S. Appl. No. 17/887,526, mailed on Apr. 11, 2025.

US Non Final OA in U.S. Appl. No. 17/816,435, mailed on Apr. 2, 2025.

US office action in U.S. Appl. No. 17/816,130, mailed on May 14, 2025.

U.S. office action in U.S. Appl. No. 17/813,409, mailed on Jun. 5, 2025.

X. Duan et al., "Novel Vertical Channel-All-Around(CAA) In-Ga-Zn-O FET for 2T0C-DRAM With Density Beyond 4F2 by Monolithic Stacking," in IEEE Transactions on Electron Devices, vol. 69, No. 4, pp. 2196-2202, Apr. 2022.

U.S. office action in U.S. Appl. No. 17/816,435, mailed on Aug. 22, 2025.

* cited by examiner

TRANSISTOR AND MANUFACTURING METHOD THEREOF, AND MEMORY

CROSS-REFERENCE TO RELATED APPLICATIONS

This is a continuation of International Application No. PCT/CN2022/098249, filed on Jun. 10, 2022, which claims the priority to Chinese Patent Application No. 202210608341.1, titled "TRANSISTOR AND MANUFACTURING METHOD THEREOF, AND MEMORY" and filed with the China National Intellectual Property Administration (CNIPA) on May 31, 2022. The entire contents of International Application No. PCT/CN2022/098249 and Chinese Patent Application No. 202210608341.1 are incorporated herein by reference.

TECHNICAL FIELD

The present disclosure relates to the technical field of semiconductors, and in particular to a transistor and a manufacturing method thereof, and a memory.

BACKGROUND

With the continuous development of science and technology, semiconductor structures, especially memories, are increasingly widely used. The memory includes a plurality of transistors, and the transistors are generally metal-oxide-semiconductor (MOS) transistors. The MOS transistor generally includes a source, a drain, a channel between the source and the drain, a gate opposite to the channel, and a dielectric layer disposed between the gate and the channel. The MOS transistor uses an electric field formed by the gate to control an amount of induced charge in the channel, to further change a state of the channel, thereby controlling a drain current. However, a reverse leakage current of the foregoing transistor is relatively large, affecting the performance of the transistor.

SUMMARY

In view of the foregoing problem, embodiments of the present disclosure provide a transistor and a manufacturing method thereof, and a memory.

According to some embodiments, a first aspect of the present disclosure provides a transistor, including: a channel, wherein an accommodation space is formed therein;
a gate, provided with a first end and a second end that are opposite, wherein the first end of the gate is located inside the accommodation space, and the second end of the gate is located outside the accommodation space;
a dielectric layer, located between the gate and the channel, insulating and isolating the gate and the channel;
a source, provided at one end of the channel; and
a drain, provided at the other end of the channel, wherein the drain and the source are arranged at intervals along a length direction of the channel, and
the source, the drain, and the channel are each made of a semiconductor material.

According to some embodiments, a second aspect of the present disclosure provides a memory, including a plurality of transistors described above.

According to some embodiments, a third aspect of the present disclosure provides a method of manufacturing a transistor, including: forming a stacked structure, wherein the stacked structure includes a first semiconductor material layer, an insulating layer, and a second semiconductor material layer that are sequentially stacked, one of the first semiconductor material layer and the second semiconductor material layer forms a source, and the other forms a drain;
forming a first filling space in the stacked structure, wherein the first filling space runs through the second semiconductor material layer and the insulating layer, and extends to the first semiconductor material layer;
forming a third semiconductor material layer on a sidewall and a bottom wall of the first filling space, wherein the third semiconductor material layer forms a channel; and the channel located inside the first filling space defines a second filling space;
forming a dielectric layer on a sidewall and a bottom wall of the second filling space, wherein the dielectric layer located inside the second filling space defines a third filling space; and
forming a gate inside the third filling space, wherein a first end of the gate is located inside the third filling space, and a second end of the gate is located outside the third filling space.

DETAILED DESCRIPTION

A transistor in the related art has a problem that a reverse leakage current is relatively large. It is found by the inventor through research that the reason is that the transistor includes a source, a drain, and a channel located between the source and the drain, the source and the drain of the transistor usually adopt a metal material, for example, molybdenum, the channel usually adopts a semiconductor material, for example, silicon, and metal-semiconductor contact is formed between the source and the channel, and between the drain and the channel.

Because a conduction band and a valence band of the metal material overlap, a Fermi energy level thereof is in the conduction band, a conduction band and a valence band of the semiconductor are separated, and a Fermi energy level thereof is between the conduction band and the valence band, the Fermi energy level of the semiconductor material is higher than the Fermi energy level of the metal material. When the metal material is in contact with the semiconductor material, carriers diffuse and flow, and a balancing state is achieved only when Fermi energy levels on two sides of a contact surface are equal. Therefore, after the contact, electrons in the semiconductor material flow to the metal material, and an energy band of the semiconductor material is bent by a built-in electric field. Consequently, a Schottky barrier is formed on the contact surface of the metal material and the semiconductor material.

The Schottky barrier may be used to control on and off of the transistor. However, a is disadvantage thereof is that a reverse leakage current is relatively large, affecting performance of the transistor. For this, an embodiment of the present disclosure provides a transistor, where a channel surrounds a gate, a dielectric layer is provided between the channel and the gate, and a source and a drain are separately located on two ends of the channel, such that a channel all around transistor is formed, where the source, the drain, and the channel of the transistor are each made of a semiconductor material, thereby reducing a reverse leakage current, and improving performance of the transistor. In addition, the channel of the channel all around transistor is longer. This can reduce and even overcome a short-channel effect, and further improve the performance of the transistor.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely a part rather than all of the embodiments of the present disclosure. All other embodiments obtained by those of ordinary skill in the art based on the embodiments of the disclosure without creative efforts shall fall within the protection scope of the present disclosure.

Figure 1:
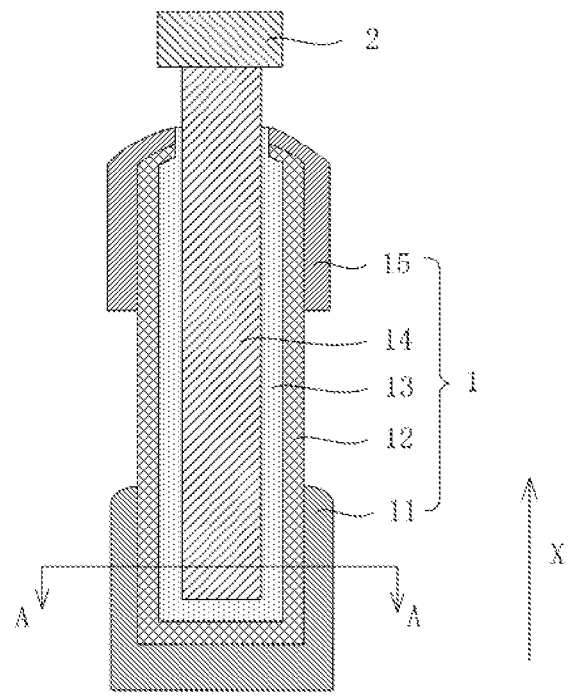
FIG. 1 is a schematic structural diagram of a transistor according to an embodiment of the present disclosure.
Figure 2:
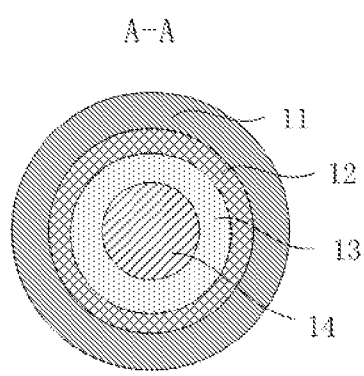
FIG. 2 is a schematic diagram of a cross section at A in FIG. 1.

Refer to FIG. 1 and FIG. 2. FIG. 1 is a schematic structural diagram of a transistor according to an embodiment of the present disclosure. The transistor 1 includes: a source 11, a drain 15, a gate 14, a channel 12, and a dielectric layer 13. An accommodation space is formed inside the channel 12. The gate 14 has a first end and a second end that are opposite. The first end of the gate 14 is located inside the accommodation space, and the second end of the gate 14 is located outside the accommodation space. The dielectric layer 13 is located between the gate 14 and the channel 12, to insulate and isolate the gate 14 and the channel 12.

As shown in FIG. 1 and FIG. 2, a part of an outer surface of the gate 14 wraps the dielectric layer 13, an outer surface of the dielectric layer 13 wraps the channel 12, and the channel 12 is not in contact with the gate 14, to form a channel all around transistor. The channel 12 of the channel all around transistor is longer. This may reduce and even overcome a short-channel effect, and improve the performance of the transistor 1. In addition, the channel all around transistor may further overcome a floating body effect, and further improve the performance of the transistor 1.

Specifically, referring to FIG. 1, the gate 14 may be columnar, and extends along a first direction, where the first direction is, for example, a vertical direction (direction X) as shown in FIG. 1. The first end and the second end of the gate 14 are oppositely provided along the first direction, for example, the first end of the gate 14 is a top end of the gate 14 (an upper end as shown in FIG. 1), and the second end of the gate 14 is a bottom end of the gate 14 (a lower end as shown in FIG. 1). A material of the gate 14 may be metal or alloy, for example, titanium (Ti), titanium nitride (TiN), tungsten (W), and aluminum (Al). In some possible examples, with a plane perpendicular to the first direction as a cross section, a cross-sectional shape of the gate 14 may be a circle, an ellipse, a square, a rectangle, a trapezoid, a cross, or the like. For example, as shown in FIG. 2, the cross-sectional shape of the gate 14 is a circle. Certainly, the cross-sectional shape of the gate 14 may alternatively be another polygon, for example, an orthogonal pentagon, and the cross-sectional shape is selected according to an actual need.

Sizes of cross sections of the gate 14 are the same along the first direction, that is, the gate 14 is designed to have equal cross sections, such that the gate 14 forms a column with consistent top and bottom. The size of the cross section of the gate 14 refers to an area of the cross section of the gate 14 or a diameter of the cross section of the gate 14. The size of the cross section of the gate 14 is not limited in this embodiment of the present disclosure, and selection may be performed according to an actual need.

Still referring to FIG. 1 and FIG. 2, in some possible embodiments, the channel 12 includes a top wall, a bottom wall, and a sidewall that enclose the accommodation space, the top wall is provided with an opening, and the second end of the gate 14 is exposed outside the accommodation space from the opening. The channel 12 includes a top wall and a bottom wall that are oppositely provided along the first direction, and a sidewall located between the top wall and the bottom wall. One end of the sidewall is connected to the top wall, the other end of the sidewall is connected to the bottom wall, and the top wall, the bottom wall, and the sidewall enclose and form the accommodation space.

The sidewall surrounds the gate 14. With a plane perpendicular to the first direction as a cross section, a cross-sectional shape of the sidewall may be consistent with the cross-sectional shape of the gate 14, and a center line of the sidewall coincides with a center line of the gate 14. Through such arrangement, a distance between an inner surface of the sidewall and an outer circumferential surface of the gate 14 is relatively uniform in a circumferential direction, such that a thickness of the dielectric layer 13 filled between the sidewall and the gate 14 is relatively uniform, to improve the performance of the transistor 1.

The top wall is provided with the opening in communication with the accommodation space, such that a part of the gate 14 is provided inside the accommodation space. As shown in FIG. 1, the first end of the gate 14 is located inside the accommodation space, and the second end of the gate 14 protrudes from the opening and is exposed outside the accommodation space. Through such arrangement, a part of the gate 14 is located inside the accommodation space to control carriers in the channel 12; and the other part of the gate 14 is located outside the accommodation space to connect to a peripheral circuit.

It can be understood that, with a plane perpendicular to the first direction as a cross section, a cross-sectional size of the opening is greater than that of the gate 14 opposite to the opening, such that the gate 14 protrudes therethrough. A cross-sectional shape of the opening may match the cross-sectional shape of the gate 14. For example, the cross-sectional shape of the opening and the cross-sectional shape of the gate 14 are both circular, to facilitate manufacturing of the opening and the gate 14.

In some other possible embodiments, the channel 12 includes a bottom wall and a sidewall that enclose the accommodation space, and the second end of the gate 14 is exposed outside the accommodation space. The channel 12 is approximately cylindrical, the sidewall is connected to the bottom wall, the two form the accommodation space, and the second end of the gate 14 protrudes from the accommodation space from a side away from the bottom wall.

In this embodiment of the present disclosure, a material of the channel 12 includes a semiconductor material, for example, the material of the channel 12 includes indium is gallium zinc oxide (IGZO), polycrystalline silicon (polysilicon), monocrystalline silicon, silicon germanium (SiGe), or silicon carbide (SiC). The semiconductor material is used, such that on the one hand, electron mobility thereof is relatively high, which can increase a saturation current of the channel 12, and on the other hand, the semiconductor material matches materials of the source 11 and the drain to reduce a reverse leakage current of the transistor 1, thereby improving the performance of the transistor 1.

Preferably, the material of the channel 12 is indium gallium zinc oxide. Indium gallium zinc oxide is prepared by doping indium oxide (In2O3) and gallium oxide (Ga2O3) into zinc oxide (ZnO). Indium gallium zinc oxide is transparent to visible light, and the transistor 1 formed by using indium gallium zinc oxide as a channel material may be configured to manufacture a transparent semiconductor device. Indium gallium zinc oxide may be prepared at a low temperature, and a preparation temperature of indium gallium zinc oxide is usually below 300° C. The transistor 1 formed by indium gallium zinc oxide as the channel material may be further used in a flexible semiconductor device. The electron mobility of indium gallium zinc oxide is relatively high and may reach 10-30 $cm^2/V \cdot sec$. Using indium gallium zinc oxide as the channel material can increase an information transmission amount of the transistor 1, reduce a size of the transistor 1, and increase a density of transistors 1. In addition, an Ion/Ioll ratio of the transistor 1 formed by using indium gallium zinc oxide as the channel material is relatively large and is usually greater than $10^8$, and a leakage current is relatively small. This can improve the performance of the transistor 1.

Still referring to FIG. 1 and FIG. 2, the dielectric layer 13 is located between the gate 14 and the channel 12, to insulate and isolate the gate 14 and the channel 12. Specifically, the dielectric layer 13 wraps the first end of the gate 14 and a part of a region close to the first end, and the channel 12 wraps the dielectric layer 13.

The dielectric layer 13 is of an insulating material, for example, a material of the dielectric layer 13 may include a high-k dielectric material, silicon oxide ($SiO_2$), silicon nitride (SiN), silicon oxynitride (SiON), or a combination thereof. The high-k dielectric material may include hafnium oxide ($HfO_2$), hafnium silicon oxide ($HfSiO_2$), lanthanum oxide (LaO), zirconium oxide ($ZrO_2$), zirconium silicon oxide ($ZrSiO_2$), tantalum oxide is ($Ta_2O_5$), titanium oxide ($TiO_2$), barium strontium titanium oxide ($BaSrTiO_3$), barium titanium oxide ($BaTiO_3$), strontium titanium oxide ($SrTiO_3$), lithium oxide ($Li_2O$), aluminum oxide ($Al_2O_3$), lead scandium tantalum oxide (PbScTaO), lead zinc niobate ($PbZnNbO_3$), or a combination thereof.

Referring to FIG. 1, the source 11 is provided at one end of the channel 12, the drain is provided at the other end of the channel 12, and the drain 15 and the source 11 are arranged at intervals along a length direction of the channel 12. The length direction of the channel 12 is the first direction and is consistent with an extending direction of the gate 14. The drain 15 and the source 11 are arranged at intervals, to prevent the drain 15 from being in contact with the source 11, thereby ensuring that the transistor 1 can normally work.

In the embodiments in which the channel 12 includes the top wall, the bottom wall, and the sidewall, in a possible implementation, one of the source 11 and the drain 15 covers the bottom wall of the channel 12 and covers a part of the sidewall close to the bottom wall; and the other of the source 11 and the drain 15 covers the top wall of the channel 12 and covers a part of the sidewall close to the top wall. For example, the source 11 is close to the first end of the gate 14 and the drain 15 is close to the second end of the gate 14.

As shown in FIG. 1, the channel 12 may be divided into an upper portion, an intermediate portion, a lower portion along the first direction, one of the source 11 and the drain 15 covers the upper portion of the channel 12, one of the source 11 and the drain covers the lower portion of the channel 12, and the intermediate portion of the channel 12 is exposed. Through such arrangement, contact areas between the source 11 and the channel 12 and between the drain 15 and the channel 12 are relatively large. This can improve the performance of the transistor 1.

In the embodiments in which the channel 12 includes the top wall, the bottom wall, and the sidewall, in another possible implementation, one of the source 11 and the drain covers the bottom wall of the channel 12, and the other of the source 11 and the drain covers the top wall of the channel 12, that is, the source 11 and the drain 15 are separately provided on two opposite ends of the channel 12.

In another possible embodiment, one of the source 11 and the drain 15 covers a part of the sidewall close to the bottom wall, and the other of the source 11 and the drain 15 covers a part of the sidewall close to the top wall, that is, the source 11 and the drain 15 are provided surrounding the channel 12, and the source 11 and the drain 15 are both in parallel to the sidewall of the channel 12.

Still referring to FIG. 1 and FIG. 2, the source 11 and the drain 15 are of a semiconductor material, and the channel 12 is also of a semiconductor material, such that semiconductor-semiconductor contact is formed between the source 11 and the channel 12, and between the drain 15 and the channel 12. Compared with a transistor with metal-semiconductor contact, the transistor 1 with semiconductor-semiconductor contact overcomes a Schottky barrier and has a relatively small reverse leakage current, thereby improving the performance of the transistor 1.

Specifically, materials of the source 11 and the drain 15 may be the same and are different from the material of the channel 12. For example, the materials of the source 11 and the drain 15 are polycrystalline silicon, and the material of the channel 12 is indium gallium zinc oxide. Preferably, the source 11 and/or the drain 15 are/is made of a doped semiconductor material. That is, at least one of the source 11 and the drain 15 is made of a doped semiconductor material. Electrical performance thereof can be improved through doping, thereby improving the performance of the transistor 1.

In some possible embodiments, the source 11 and the drain 15 are each made of a doped polycrystalline silicon material. N-type doping or P-type doping is performed in the polycrystalline silicon material, such that a resistance of the polycrystalline silicon material can be reduced and a work function of the polycrystalline silicon material is adjusted. N-type doping is performed by doping with phosphorus or arsenic, and P-type doping is performed by doping with boron. The doping may be implemented by using an ion implantation process or diffusion process.

In the foregoing embodiments, doping types of the source 11 and the drain 15 match a conductive type of the channel 12. Specifically, the conductive type of the channel 12 is an N type and the doping types of the source 11 and the drain 15 are N-type doping; or the conductive type of the channel 12 is a P type, and the doping types of the source 11 and the drain 15 are P-type doping. That is, the doping types of the source 11, the channel 12, and the drain 15 are the same and there is no PN junction. Through such arrangement, the transistor 1 is formed as a junctionless field effect transistor (JLT), which changes an electric field strength perpendicular to the channel 12 by using a bias voltage of the gate 14, such that the majority of carriers in the channel 12 are accumulated or depleted, thereby modulating a channel conductance and controlling a channel current. A size of the junctionless field effect transistor may be further reduced to facilitate forming of a fully depleted channel, and an effective channel length is further longer. This can suppress a short-channel effect.

In some possible examples, the conductive type of the channel 12 is an N type, and the doping types of the source 11 and the drain 15 are both N-type heavy doping, to form the transistor 1 having an N-type channel. Specifically, N-type doping is performed on all of the channel 12, the source 11, and the drain 15, and doping concentrations of the source 11 and the drain 15 are both higher than a doping concentration of the channel 12. For example, heavy doping is performed on the source 11 and the drain 15 to form an N+ region, and relatively-heavy doping (intermediate doping) is performed on the channel 12 to form an N region.

In some other possible examples, the conductive type of the channel 12 is a P type and the doping types of the source 11 and the drain 15 are both P-type heavy doping, to form the transistor 1 having a P-type channel. Specifically, P-type doping is performed on all of the channel 12, the source 11, and the drain 15, and doping concentrations of the source 11 and the drain 15 are both higher than a doping concentration of the channel 12. For example, heavy doping is performed on the source 11 and the drain 15 to form a P+ region, and relatively heavy doping (intermediate doping) is performed on the channel 12 to form a P region.

Still referring to FIG. 1, the second end of the gate 14 is further electrically connected to a contact plug 2, to connect the gate 14 to a peripheral circuit, and control the transistor 1 by using the peripheral circuit. The contact plug 2 is in contact with the second end of the gate 14, and a material thereof may be metal or alloy, for example, tungsten or titanium nitride, which has a relatively small resistance.

In conclusion, the transistor 1 provided in this embodiment of the present disclosure includes the channel 12, the source 11 provided at one end of the channel 12, the drain provided at the other end of the channel 12, the gate 14, and the dielectric layer 13 located between the gate 14 and the channel 12; the drain 15 and the source 11 are arranged at intervals along the length direction of the channel 12, the accommodation space is formed inside the channel 12, the first end of the gate 14 is located inside the accommodation space, the second end of the gate 14 is located outside the accommodation space, and the dielectric layer 13 insulates and isolates the gate 14 and the channel 12, to form a channel 12 all around transistor. The source 11, the drain 15, and the channel 12 of the transistor 1 are each made of a semiconductor material, such that semiconductor-semiconductor contact is formed between the source 11 and the channel 12, and between the drain 15 and the channel 12. Compared with a transistor with metal-semiconductor contact, the transistor 1 with semiconductor-semiconductor contact is formed as a junctionless field effect transistor, which has a fully depleted channel, can overcome a Schottky barrier and a floating body effect, and has a relatively small reverse leakage current, thereby improving performance of the transistor 1. In addition, the channel 12 of the channel all around transistor is longer. This can reduce and even overcome a short-channel effect, and further improve the performance of the transistor 1.

An embodiment of the present disclosure further provides a memory. The memory may include, for example, a dynamic random access memory (DRAM), a static random access memory (SRAM), a flash memory, an electrically erasable programmable read-only memory (EEPROM), a phase change random access memory (PRAM), a magneto-resistive random access memory (MRAM), or the like.

The memory includes the transistor in the foregoing embodiments, for example, the memory is a dynamic random access memory, and includes a plurality of transistors and a plurality of capacitors. The plurality of transistors are one-to-one electrically connected to the plurality of capacitors, that is, each transistor is electrically connected to one capacitor, and the transistor is used to control on or off of the capacitor. The memory in this embodiment of the present disclosure includes the foregoing transistor, and therefore is has at least an advantage that a reverse leakage current is relatively small. In addition, in a specific memory structure, especially in a DRAM structure, power consumption due to repeated refreshing can be effectively reduced, and overall power consumption of the memory can be effectively reduced.

Figure 3:
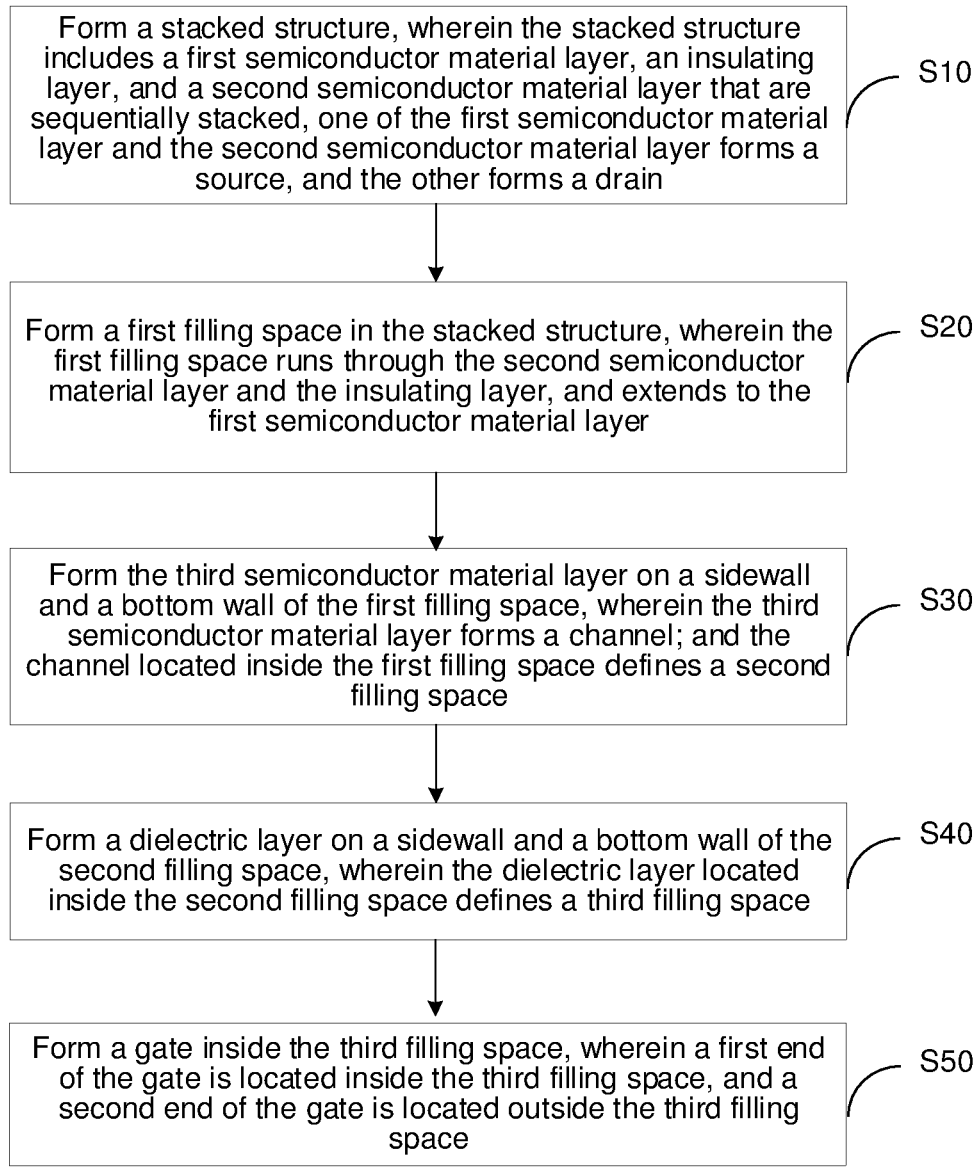
FIG. 3 is a flowchart of a method of manufacturing a transistor according to an embodiment of the present disclosure.

An embodiment of the present disclosure further provides a method of manufacturing a transistor. Referring to FIG. 3, the manufacturing method includes the following steps.

Step S10: Form a stacked structure, wherein the stacked structure includes a first semiconductor material layer, an insulating layer, and a second semiconductor material layer that are sequentially stacked, one of the first semiconductor material layer and the second semiconductor material layer forms a source, and the other forms a drain.

Figure 4:
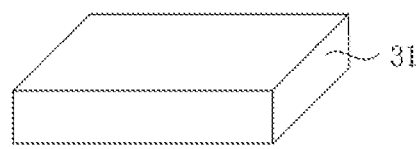
FIG. 4 is a schematic structural diagram after a first semiconductor material layer is formed according to an embodiment of the present disclosure.
Figure 5:
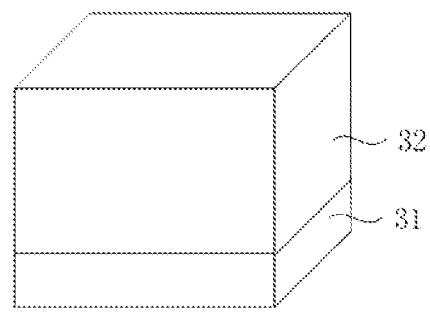
FIG. 5 is a schematic structural diagram after an insulating layer is formed according to an embodiment of the present disclosure.
Figure 6:
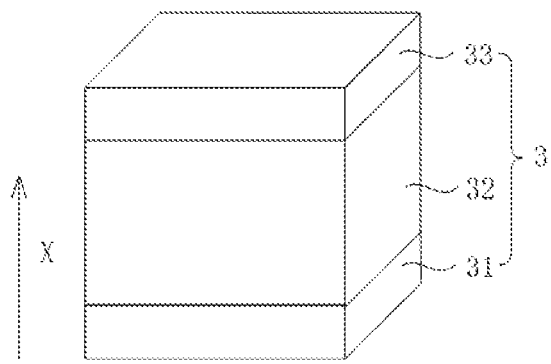
FIG. 6 is a schematic structural diagram after a second semiconductor material layer is formed according to an embodiment of the present disclosure.

Referring to FIG. 4 to FIG. 6, a stacked structure 3 includes a first semiconductor material layer 31, an insulating layer 32, and a second semiconductor material layer 33, and the first semiconductor material layer 31, the insulating layer 32, and the second semiconductor material layer 33 are sequentially stacked along a first direction, where the first direction is a vertical direction (direction X) as shown in FIG. 6.

For example, the insulating layer 32 is provided on the first semiconductor material layer 31 and the second semiconductor material layer 33 is provided on the insulating layer 32. A material of the insulating layer 32 may be oxide. A material of the first semiconductor material layer 31 may be the same as or different from that of the second semiconductor material layer 33. One of the first semiconductor material layer 31 and the second semiconductor material layer 33 forms the source and the other forms the drain, that is, the source and the drain are each made of a semiconductor material. For example, the first semiconductor material layer 31 forms the source and the second semiconductor material layer 33 forms drain.

In some possible embodiments, the first semiconductor material layer 31 and/or the second semiconductor material layer 33 are/is made of a doped semiconductor material.

Through such arrangement, at least one of the formed source and drain is made of a doped semiconductor material, and electrical performance of the source and/or the drain can be improved through doping, thereby improving electrical performance of the transistor.

Preferably, the first semiconductor material layer 31 and the second semiconductor material layer 33 are each made of a doped polycrystalline silicon material. N-type doping or P-type doping is performed in the polycrystalline silicon material, such that a resistance of the polycrystalline silicon material can be reduced and a work function of the polycrystalline silicon material is adjusted. N-type doping is performed by doping with phosphorus or arsenic, and P-type doping is performed by doping with boron. The doping may be implemented by using an ion implantation process or diffusion process.

In some possible implementations, the stacked structure 3 may be formed in the following process: referring to FIG. 4, depositing the first semiconductor material layer 31; referring to FIG. 5, depositing the insulating layer 32 on the first semiconductor material layer 31; and referring to FIG. 6, depositing the second semiconductor material layer 33 on the insulating layer 32. The insulating layer 32 isolates the first semiconductor material layer 31 and the second semiconductor material layer 33, to ensure that the first semiconductor material layer 31 is insulated from the second semiconductor material layer 33.

The deposition may be a chemical vapor deposition (CVD), a physical vapor deposition (PVD), an atomic layer deposition (ALD), or the like.

Step S20: Form a first filling space in the stacked structure, wherein the first filling space runs through the second semiconductor material layer and the insulating layer, and extends to the first semiconductor material layer.

Figure 7:
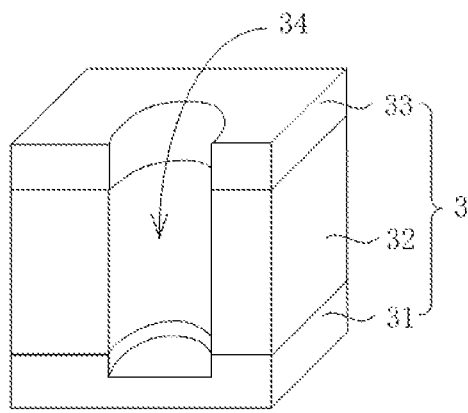
FIG. 7 is a schematic structural diagram after a first filling space is formed according to an embodiment of the present disclosure.

Referring to FIG. 7, the stacked structure 3 is etched, to form the first filling space 34 in the stacked structure 3, where the first filling space 34 runs through the second semiconductor material layer 33 and the insulating layer 32, but does not run through the first semiconductor material layer 31. That is, a bottom wall of the first filling space 34 is located in the first semiconductor material layer 31. Through such arrangement, the first semiconductor material layer 31 is more exposed in the first filling space 34. Subsequently, when a channel is formed, a contact area between the channel and the first semiconductor material layer 31 increases, thereby increasing a contact area between the channel and the source or the drain.

The first filling space 34 may be hole-shaped or slot-shaped. With a plane is perpendicular to the first direction as a cross section, a cross-sectional shape of the first filling space 34 may be a circle, an ellipse, a square, a rectangle, a trapezoid, a cross, or the like.

Step S30: Form the third semiconductor material layer on a sidewall and a bottom wall of the first filling space, wherein the third semiconductor material layer forms the channel; and the channel located inside the first filling space defines the second filling space.

Figure 8:
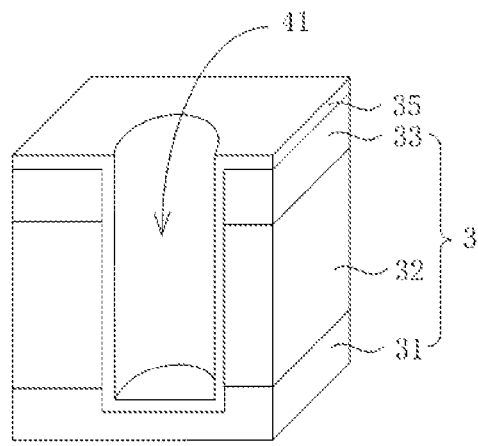
FIG. 8 is a schematic structural diagram after a second filling space is formed according to an embodiment of the present disclosure.

Referring to FIG. 7 and FIG. 8, the third semiconductor material layer 35 covers the sidewall and the bottom wall of the first filling space 34, and is in contact with both the first semiconductor material layer 31 and the second semiconductor material layer 33, and the third semiconductor material layer 35 is used to form the channel. The source, the drain, and the channel are each made of a semiconductor material, such that semiconductor-semiconductor contact is formed between the source and the channel, and between the drain and the channel. Compared with a transistor with metal-semiconductor contact, the transistor 1 with semiconductor-semiconductor contact overcomes a Schottky barrier, and has a relatively small reverse leakage current, thereby improving performance of the transistor 1.

A material of the third semiconductor material layer 35 includes one from the group consisting of indium gallium zinc oxide, polycrystalline silicon, monocrystalline silicon, silicon-germanium, and silicon carbide. The semiconductor material is used, such that on the one hand, electron mobility thereof is relatively high, which can increase a saturation current of the channel, and on the other hand, the semiconductor material matches materials of the source and the drain to reduce a reverse leakage current of the transistor, thereby improving the performance of the transistor.

Preferably, the material of the third semiconductor material layer 35 is indium gallium zinc oxide, where a transistor formed by using indium gallium zinc oxide as a channel may be configured to manufacture a transparent semiconductor device. A preparation temperature of indium gallium zinc oxide is usually below 300° C. The transistor formed by using indium gallium zinc oxide as the channel may be further used in a flexible semiconductor device. The electron mobility of indium gallium zinc oxide is relatively high. Using indium gallium zinc oxide as the channel can increase an information transmission amount of the transistor, reduce a size of the transistor, and increase a density of transistors. In addition, an Ion/Ioll ratio of the transistor formed by using indium gallium zinc oxide as the channel is relatively large, and a leakage current is relatively small. This can improve the performance of the transistor.

To further improve the performance of the transistor, doping may be performed on the first semiconductor material layer 31, the second semiconductor material layer 33, and the third semiconductor material layer 35, and doping types of the first semiconductor material layer 31 and the second semiconductor material layer 33 match a conductive type of the third semiconductor material layer 35.

Specifically, the conductive type of the third semiconductor material layer 35 is an N type and the doping types of the first semiconductor material layer 31 and the second semiconductor material layer 33 are N-type doping; or the conductive type of the third semiconductor material layer 35 is a P type and the doping types of the first semiconductor material layer 31 and the second semiconductor material layer 33 are P-type doping. That is, the doping types of the first semiconductor material layer 31, the second semiconductor material layer 33, and the third semiconductor material layer 35 are the same. Through such arrangement, a subsequently formed transistor is a junctionless filed effect transistor, a size thereof may be further reduced to facilitate forming of a fully depleted channel, and an effective channel length is further longer. This can suppress a short-channel effect.

In some possible examples, the conductive type of the third semiconductor material layer 35 is an N type, and the doping types of the first semiconductor material layer 31 and the second semiconductor material layer 33 are both N-type heavy doping. In some other possible examples, the conductive type of the third semiconductor material layer 35 is a P type, and the doping types of the first semiconductor material layer 31 and the second semiconductor material layer 33 are both P-type heavy doping. Doping concentrations of the first semiconductor material layer 31 and the second semiconductor material layer 33 are both higher than a doping concentration of the third semiconductor material layer 35. For example, heavy doping is performed on the first semiconductor material layer 31 and the second semiconductor material layer 33, and relatively heavy doping (intermediate doping) is performed on the third semiconductor material layer 35.

Still referring to FIG. 8, in some possible implementations, forming the third semiconductor material layer 35 on the sidewall and the bottom wall of the first filling space 34, where the third semiconductor material layer 35 forms the channel 12; and the channel 12 located inside the first filling space 34 defines the second filling space 41 includes: depositing the third semiconductor material layer 35 on the sidewall and the bottom wall of the first filling space 34 and on the second semiconductor material layer 33. The third semiconductor material layer 35 covers the sidewall and the bottom wall of the first filling space 34 and a top surface of the second semiconductor material layer 33, to facilitate forming of the third semiconductor material layer 35.

Step S40: Form the dielectric layer on the sidewall and the bottom wall of the second filling space, wherein the dielectric layer located inside the second filling space defines the third filling space.

Figure 9:
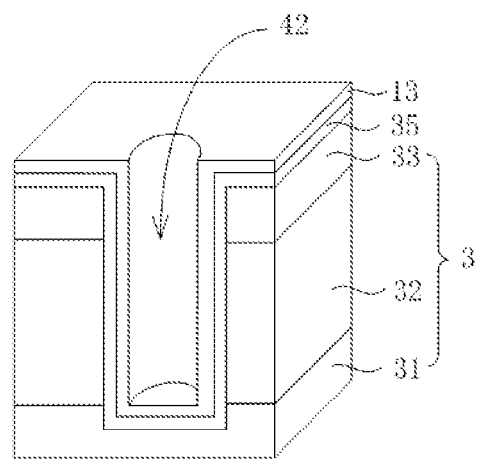
FIG. 9 is a schematic structural diagram after a third filling space is formed according to an embodiment of the present disclosure.

Referring to FIG. 8 and FIG. 9, the dielectric layer 13 covers the sidewall and the bottom wall of the second filling space 41, and the dielectric layer 13 located inside the second filling space 41 defines the third filling space 42, to isolate a structure inside the third filling space 42 from the third semiconductor material layer 35, and ensure that the two are insulated from each other. The dielectric layer 13 is of an insulating material, for example, the material of the dielectric layer 13 may be silicon oxide, silicon nitride, silicon oxynitride, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

In some possible implementations, forming the dielectric layer 13 on the sidewall and the bottom wall of the second filling space 41, where the dielectric layer 13 located inside the second filling space 41 defines the third filling space 42 includes: depositing the dielectric layer 13 on the sidewall and the bottom wall of the second filling space 41 and on the third semiconductor material layer 35. As shown in FIG. 9, the dielectric layer 13 covers the sidewall and the bottom wall of the second filling space 41, and the third is semiconductor material layer 35 faces away from a surface of the stacked structure 3, to facilitate forming of the dielectric layer 13.

Step S50: Form a gate inside the third filling space, wherein a first end of the gate is located inside the third filling space, and a second end of the gate is located outside the third filling space.

Figure 10:
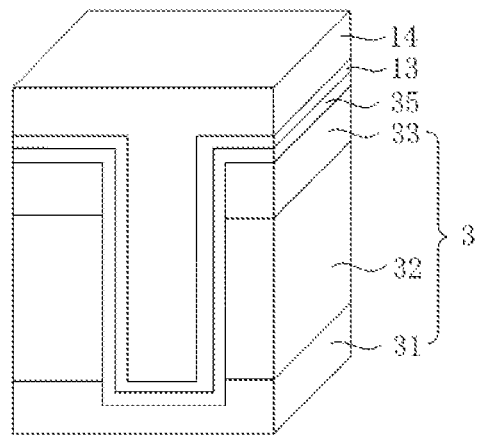
FIG. 10 is a schematic structural diagram after a gate is formed according to an embodiment of the present disclosure.

Referring to FIG. 9 and FIG. 10, the gate 14 fills the third filling space 42 and extends outside the third filling space 42. For example, the gate 14 has the first end and the second end that are oppositely provided, where the first end of the gate 14 is located inside the third filling space 42, and the second end of the gate 14 is located outside the third filling space.

In some possible implementations, forming the gate 14 inside the third filling space 42, where the first end of the gate 14 is located inside the third filling space 42, and the second end of the gate 14 is located outside the third filling space 42 includes: depositing the gate 14 inside the third filling space 42 and on the dielectric layer 13, where the gate 14 fully fills the third filling space 42 and covers the dielectric layer 13. As shown in FIG. 9 and FIG. 10, the gate 14 fills the third filling space 42 and covers the surface of the dielectric layer 13 facing away from the stacked structure 3, to facilitate forming of the gate 14.

In the method of manufacturing a transistor provided in this embodiment of the present disclosure, the first filling space 34 is formed in the stacked structure 3, and in the stacked structure 3, one of the first semiconductor material layer 31 and the second semiconductor material layer 33 forms the source and the other forms the drain; and the third semiconductor material layer 35, the dielectric layer 13, and the gate 14 are formed inside the first filling space 34, and the third semiconductor material layer 35 forms the channel, to form a channel all around transistor, where the source, the drain, and the channel of the transistor are each made of the semiconductor material, such that semiconductor-semiconductor contact is formed between the source and the channel, and between the drain and the channel. Compared with a transistor with metal-semiconductor contact, the transistor with semiconductor-semiconductor contact is formed as a junctionless field effect transistor, which has a fully depleted channel, can is overcome a Schottky barrier and a floating body effect, and has a relatively small reverse leakage current, thereby improving performance of the transistor. In addition, the channel of the channel all around transistor is longer. This can reduce and even overcome a short-channel effect, and further improve the performance of the transistor.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A transistor, comprising:
    a channel, wherein the channel itself encloses an accommodation space;
    a gate, provided with a first end and a second end that are opposite, wherein the first end of the gate is located inside the accommodation space, and the second end of the gate is located outside the accommodation space;
    a dielectric layer, located between the gate and the channel, insulating and isolating the gate and the channel;
    a source, provided at one end of the channel; and a drain, provided at the other end of the channel, wherein the drain and the source are arranged at intervals along a length direction of the channel, and the source, the drain, and the channel are each made of a semiconductor material.

2. The transistor according to claim 1, wherein at least one of the source or the drain are/is made of a doped semiconductor material.

3. The transistor according to claim 2, wherein the source and the drain are each made of a doped polycrystalline silicon material.

4. The transistor according to claim 3, wherein doping types of the source and the drain match a conductive type of the channel.

5. The transistor according to claim 4, wherein the conductive type of the channel is an N type, and the doping types of the source and the drain are both N-type heavy doping; or the conductive type of the channel is a P type, and the doping types of the source and the drain are both P-type heavy doping.

6. The transistor according to claim 1, wherein a material of the channel comprises indium gallium zinc oxide, polycrystalline silicon, monocrystalline silicon, silicon-germanium, or silicon carbide.

7. The transistor according to claim 1, wherein the channel comprises a top wall, a bottom wall, and a sidewall that enclose the accommodation space, the top wall is provided with an opening, and the second end of the gate is exposed outside the accommodation space from the opening.

8. The transistor according to claim 7, wherein one of the source and the drain covers the bottom wall of the channel and covers a part of the sidewall close to the bottom wall; and the other of the source and the drain covers the top wall of the channel and covers a part of the sidewall close to the top wall.

9. The transistor according to claim 1, wherein a cross section of the gate is circular, elliptical, square, rectangular, trapezoidal, or cross-shaped.

10. A memory, comprising a plurality of transistors according to claim 1.

* * * * *